(12) United States Patent
Weber

(10) Patent No.: US 9,048,247 B2
(45) Date of Patent: Jun. 2, 2015

(54) METHOD FOR PRODUCING A METAL STRUCTURE IN A SEMICONDUCTOR SUBSTRATE

(71) Applicant: Heribert Weber, Nuertingen (DE)

(72) Inventor: Heribert Weber, Nuertingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/306,164

(22) Filed: Jun. 16, 2014

(65) Prior Publication Data

US 2014/0377933 A1    Dec. 25, 2014

(30) Foreign Application Priority Data

Jun. 19, 2013    (DE) .......................... 10 2013 211 562

(51) Int. Cl.
| H01L 21/20 | (2006.01) |
| H01L 21/44 | (2006.01) |
| H01L 49/02 | (2006.01) |

(52) U.S. Cl.
CPC ..................... *H01L 28/60* (2013.01)

(58) Field of Classification Search
CPC ....................................... H01L 28/60
USPC ......................... 438/393, 619, 674
See application file for complete search history.

(56) References Cited

U.S. PATENT DOCUMENTS

| 6,051,866 | A  | * | 4/2000 | Shaw et al. ............. 257/417 |
| 8,329,579 | B2 | * | 12/2012 | Sanders et al. ............. 438/667 |
| 2002/0001871 | A1 | * | 1/2002 | Cho et al. ............. 438/98 |
| 2005/0109081 | A1 | * | 5/2005 | Zribi et al. ............. 73/31.05 |
| 2007/0042558 | A1 | * | 2/2007 | Villa et al. ............. 438/311 |
| 2007/0278619 | A1 | * | 12/2007 | Clevenger et al. ............. 257/532 |
| 2011/0049622 | A1 | * | 3/2011 | Kitahara ............. 257/337 |
| 2012/0267773 | A1 | * | 10/2012 | Ebefors et al. ............. 257/692 |
| 2012/0326248 | A1 | * | 12/2012 | Daneman et al. ............. 257/415 |
| 2013/0105968 | A1 | * | 5/2013 | Lu et al. ............. 257/737 |
| 2013/0221457 | A1 | * | 8/2013 | Conti et al. ............. 257/416 |
| 2014/0117472 | A1 | * | 5/2014 | Gonska et al. ............. 257/415 |

FOREIGN PATENT DOCUMENTS

EP             2 408 006          1/2012

* cited by examiner

*Primary Examiner* — Alexander Ghyka
(74) *Attorney, Agent, or Firm* — Kenyon & Kenyon LLP

(57) ABSTRACT

A method for producing a metal structure in a semiconductor substrate includes: producing an opening in the rear side of the semiconductor substrate in the area of the metal structure to be produced, which extends to the front side layer structure; filling the opening at least partially with a metal so that a metal structure is created which extends from the rear side of the semiconductor substrate to the front side layer structure; masking the rear side of the semiconductor substrate for a trench process for exposing the metal structure in such a way that the trench mask includes a lattice structure in an area adjacent to the metal structure; producing an isolation trench adjacent to the metal structure, the metal structure acting as a lateral etch stop and the lattice structure being laterally undercut in the trench mask; and applying a sealing layer to the mask.

9 Claims, 14 Drawing Sheets

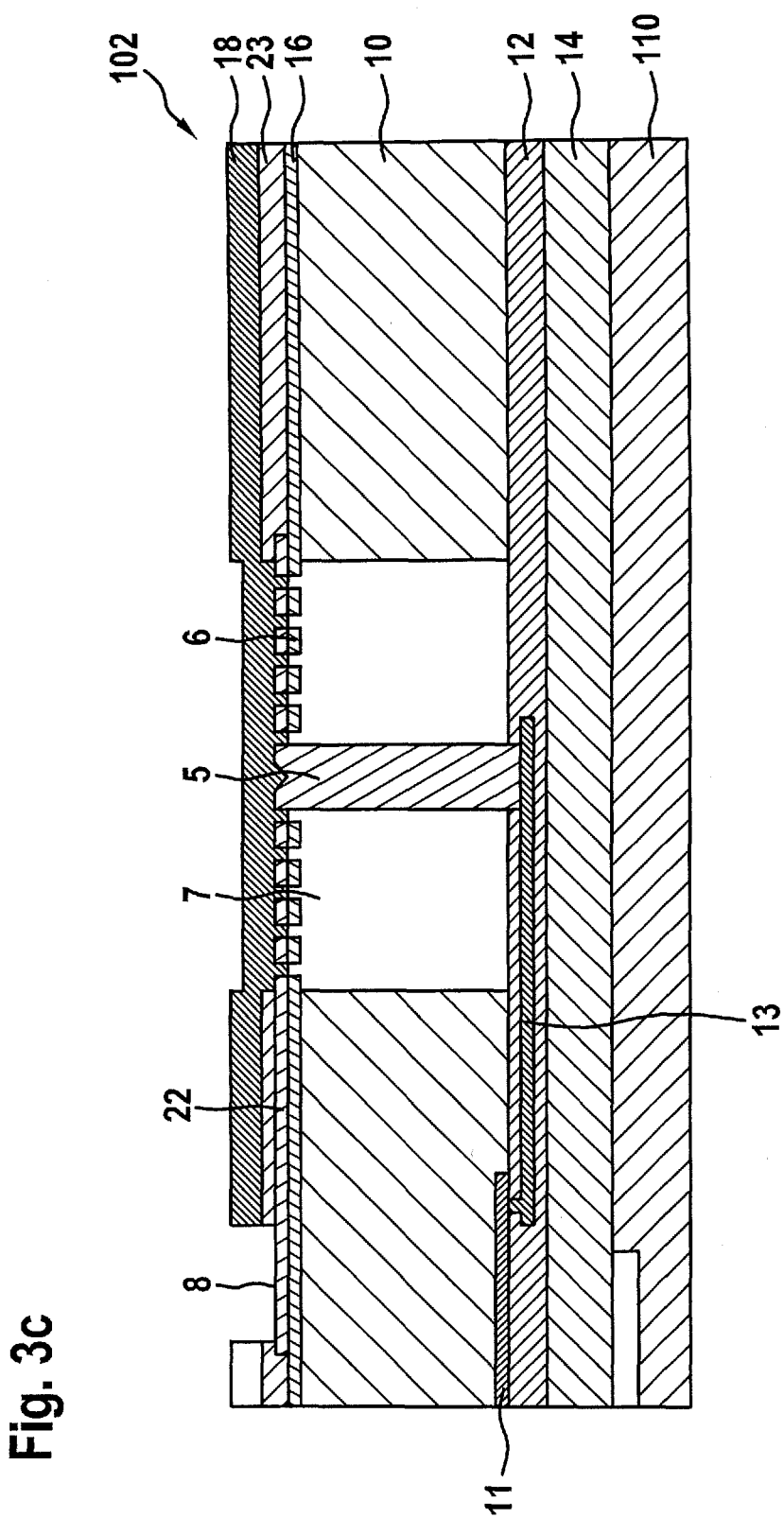

METHOD FOR PRODUCING A METAL STRUCTURE IN A SEMICONDUCTOR SUBSTRATE

BACKGROUND OF THE INVENTION

1. Field of the Invention

The present invention relates to a method for producing a metal structure in a semiconductor substrate, the front side of which is provided with a layer structure.

2. Description of the Related Art

This method is suited in particular for implementing low-resistance vias in an ASIC or MEMS component and in cap wafers for such components. With the aid of the method in question it is also possible, however, to produce other metal structures in a semiconductor substrate, such as plate capacitors or cylindrical capacitors and coil arrangements.

The background of the subject matter for the present invention is provided in published European patent application document EP 2 408 006 A2. This publication describes a method for producing a metallic via which is electrically insulated from the adjacent semiconductor substrate by a circumferential air gap. According to EP 2 408 006 A2 a ring-shaped isolation trench is initially produced for this purpose which extends over the entire thickness of the substrate. For this purpose a trench mask having a lattice structure is used which is laterally undercut during the trench process in such a way that a continuous trench-like ditch forms in the area below the lattice structure. A dielectric material is then deposited over the lattice structure, which is also deposited on the walls of the ditch. In the process, the isolation trench is superficially sealed leaving behind an air gap in the trench-like ditch. Only then is a through-opening produced within the substrate region surrounded by the isolation trench and filled with metal.

This approach proves to be problematic in several respects. The merely superficially sealed isolation trench with the enclosed air gap is relatively sensitive to mechanical forces. This must be taken into account during later processing and, in particular, when filling the through-opening with metal. A screen printing technique, for example, should not be used in this case since the sealing layer over the isolation trench could be damaged or even destroyed by pressing on the screen. Thus, in the known method for producing a via, a filling method must be selected which is compatible with the fragile structure of the sealing layer over the circumferential isolation trench. A planarization of the rear side of the semiconductor substrate after filling the through-opening is also problematic due to the sensitivity of the via with the circumferential isolation trench. This in turn makes handling difficult during a subsequent processing of the front side of the semiconductor substrate.

Moreover, notching effects may appear when producing the circumferential isolation trench and when producing the through-opening, in particular at a high aspect ratio, since no lateral etch stop is provided in conjunction with the known method for producing a via. The resulting lateral expansion in the bottom area of the circumferential isolation trench and/or the through-opening may impair the connection contact of the via.

BRIEF SUMMARY OF THE INVENTION

The present invention provides a method for producing a metal structure in a semiconductor substrate which may be simply and cost-effectively integrated in a MEMS process and/or CMOS process, and also permits a highly space-saving implementation of electrically insulated metal structures with low parasitic capacitance relative to the surrounding substrate.

Corresponding to the method according to the present invention, at least one opening is initially produced in the rear side of the semiconductor substrate in the area of the metal structure to be produced, which extends at least to the layer structure on the front side. This opening is then filled at least partially with at least one metal so that a metal structure is created which extends from the rear side of the semiconductor substrate at least to the front side layer structure. Only then is the rear side of the semiconductor substrate masked for a trench process for exposing the metal structure, specifically in such a way that the trench mask has a lattice structure in an area adjacent to the metal structure. With the aid of this trench mask, an isolation trench is then produced adjacent to the metal structure, the metal structure acting as a lateral etch stop and the lattice structure being undercut laterally in the trench mask. Finally, at least one sealing layer is also applied to the trench mask to close off a cavity in the isolation trench below the lattice structure.

Thus, in contrast to the method known from EP 2 408 006 A2, the metal structure according to the present invention is first produced in the semiconductor substrate in this case, before the metal structure is exposed in a separate subsequent trench process. This approach is very advantageous from a technical processing point of view, since the circumferential trench with the mechanically sensitive sealing layer also cannot be produced until the very end of the entire production process, so that the production process is otherwise unaffected by it. In any case, all conceivable filling methods may be used in connection with the method according to the present invention for producing the metal structure. Moreover, the rear side of the semiconductor substrate may be readily planarized once the opening of the metal structure is filled—and before the circumferential trench with the sealing layer is produced. This also enables or simplifies handling for any processing of the front side of the semiconductor substrate.

Another essential advantage of the method according to the present invention is that the metal structure forms a lateral etch stop for the subsequent trench process, such that a period of over-etching during this trench process is relatively non-critical. The reduction of notching effects also contributes to the miniaturization of the component design. The method according to the present invention thus permits the implementation of metal structures having a defined shape, and of the related function, even in conjunction with high aspect ratios.

In one specific embodiment of the method according to the present invention, the walls of the rear opening of the metal structure are initially coated with at least one dielectric material before this opening is at least partially filled with at least one metal. This approach makes sense, in particular if, once the metal is introduced, the production process provides process steps which require high temperatures. In this case, the dielectric coating prevents an interdiffusion of the metal into the surrounding semiconductor substrate. Dielectric materials may include, for example, $SiO_2$, silicon nitride, silicon oxynitride, SiC and $Al_2O_3$. These materials may be easily deposited on the structured rear side of the semiconductor substrate with the aid of a PECVD method. At this point, it is noted that multiple insulation layers made of different dielectric materials, or a layer sequence of insulation layers and metal layers, may also be deposited on the walls of the opening of the metal structure.

For many applications such as vias or capacitor electrodes and coils, it has proven to be advantageous if the trench mask includes at least one metal layer. One reason is that metal masks are, as a rule, extremely insensitive to an etch attack in a trench process. And another reason is that electrical connections for the respective metal components may then be formed in this metal layer. In a particularly advantageous variant of the method according to the present invention, the metal layer is simply used as the trench mask layer, which forms on the rear side of the semiconductor substrate when the rear side opening for the metal structure is filled.

The method according to the present invention is particularly suited for producing metal structures in a silicon substrate, since in this case it is possible to use exclusively standard materials of MEMS and CMOS processing. This aspect is explained in greater detail below in conjunction with the exemplary embodiments.

BRIEF DESCRIPTION OF THE DRAWINGS

FIGS. 3a through 3c illustrate another variant of the method according to the present invention, in which a structured metal layer is used as a trench mask for exposing the via.

DETAILED DESCRIPTION OF THE INVENTION

Figure 1A:
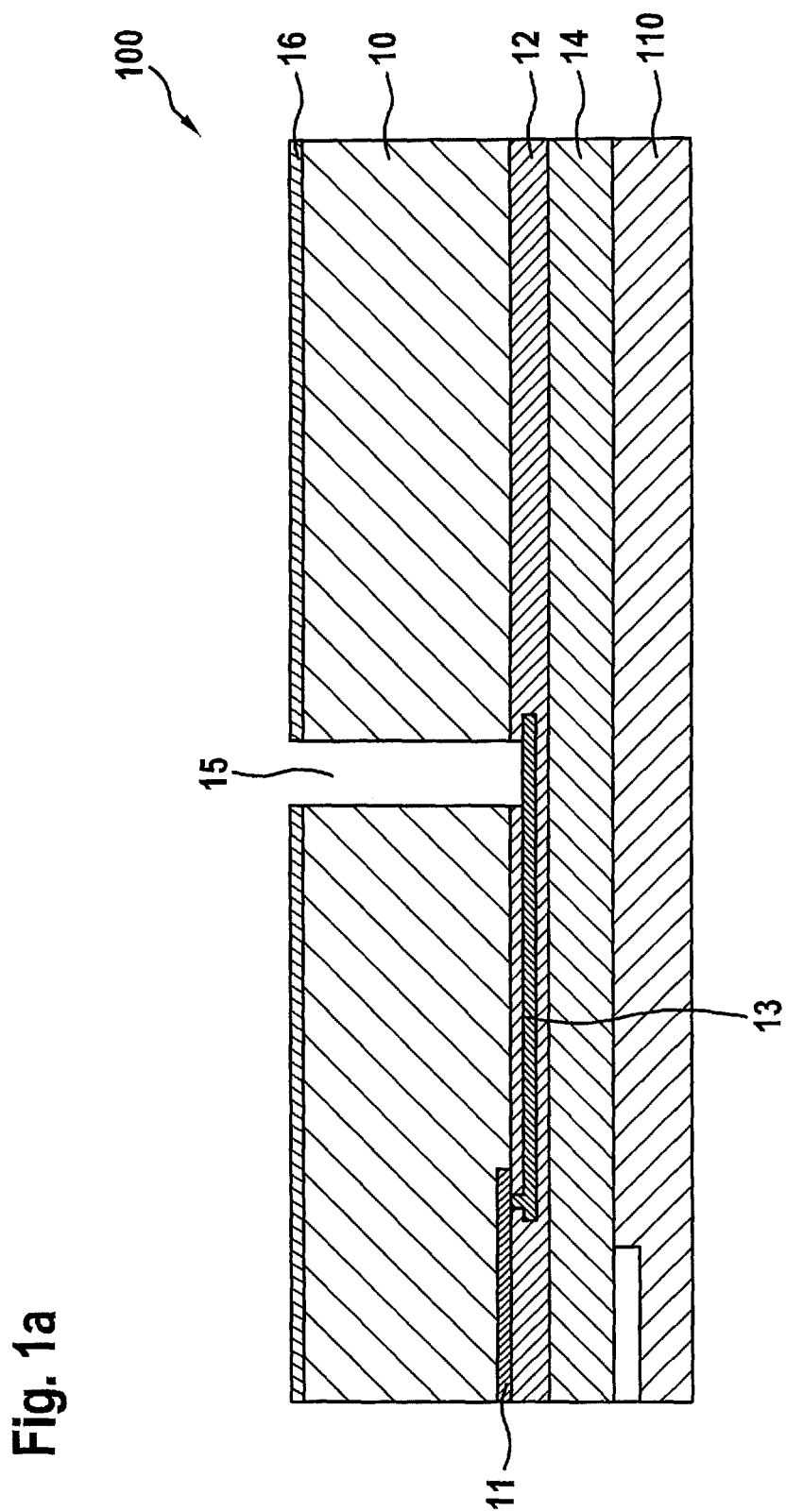
FIGS. 1a through 1e illustrate the method according to the present invention with reference to schematic sectional views through a semiconductor substrate 100 during the production of a via.

The basis of the method according to the present invention is a semiconductor substrate including a layer structure on the front side. Depending on the function of the semiconductor substrate, this layer structure may also consist solely of a passivation layer for example, in the case of a cap wafer, or also of multiple layers for implementing electrical and/or micromechanical functionalities for example, in the case of an ASIC component or MEMS component. Another layer may, as an option, also be mounted on the layer structure, for example, in the case of vertical, hybrid integrated components.

The method according to the present invention is explained below, taking as an example a MEMS component 100 including a silicon substrate 10 and a cap wafer 110. It is used in this case to produce a via in silicon substrate 10. Integrated in the front side of silicon substrate 10 are electrical components 11, which may, for example, involve parts of an evaluation circuit for the MEMS function. Situated on silicon substrate 10 is an epitaxial layer 14 including micromechanical function elements—not shown here in detail—which are insulated from silicon substrate 10 with electronic components 11 by a dielectric intermediate layer 12. The layer in this case may, for example, be an $SiO_2$ layer. Embedded in dielectric intermediate layer 12 is a metallization 13, for example, made of AlSiCu, for interconnecting electrical components 11. Cap wafer 20 which has been mounted on the front side of the layer structure is used to protect the micromechanical function elements.

In a first process sequence of the method according to the present invention, an opening 15 is produced for the via in the rear side of silicon substrate 10 and is filled with metal 5.

In the exemplary embodiment described herein, the rear side of the substrate was initially provided for this purpose with an appropriately designed masking 16. The masking may be implemented in the form of a resist mask or also in the form of a correspondingly structured $SiO_2$ layer. Both materials withstand the silicon trench process, with which the overall thickness of silicon substrate 10 is then structured in order to produce an opening 15 for the via. This trench process first stops at dielectric intermediate layer 12. In order to deepen opening 15 down to metallization 13, the dielectric material on the trench bottom in the exemplary embodiment explained here was then also removed, specifically with the aid of an anisotropic plasma etching process. The result of this rear side structuring is shown in FIG. 1a. The anisotropic plasma etching process for deepening trench opening 15 down to metallization 13 may unfold when metallization 13 has been deposited directly on the front side of silicon substrate 10 in the area of via opening 15. In this case, the trench process stops on metallization 13.

Figure 1B:
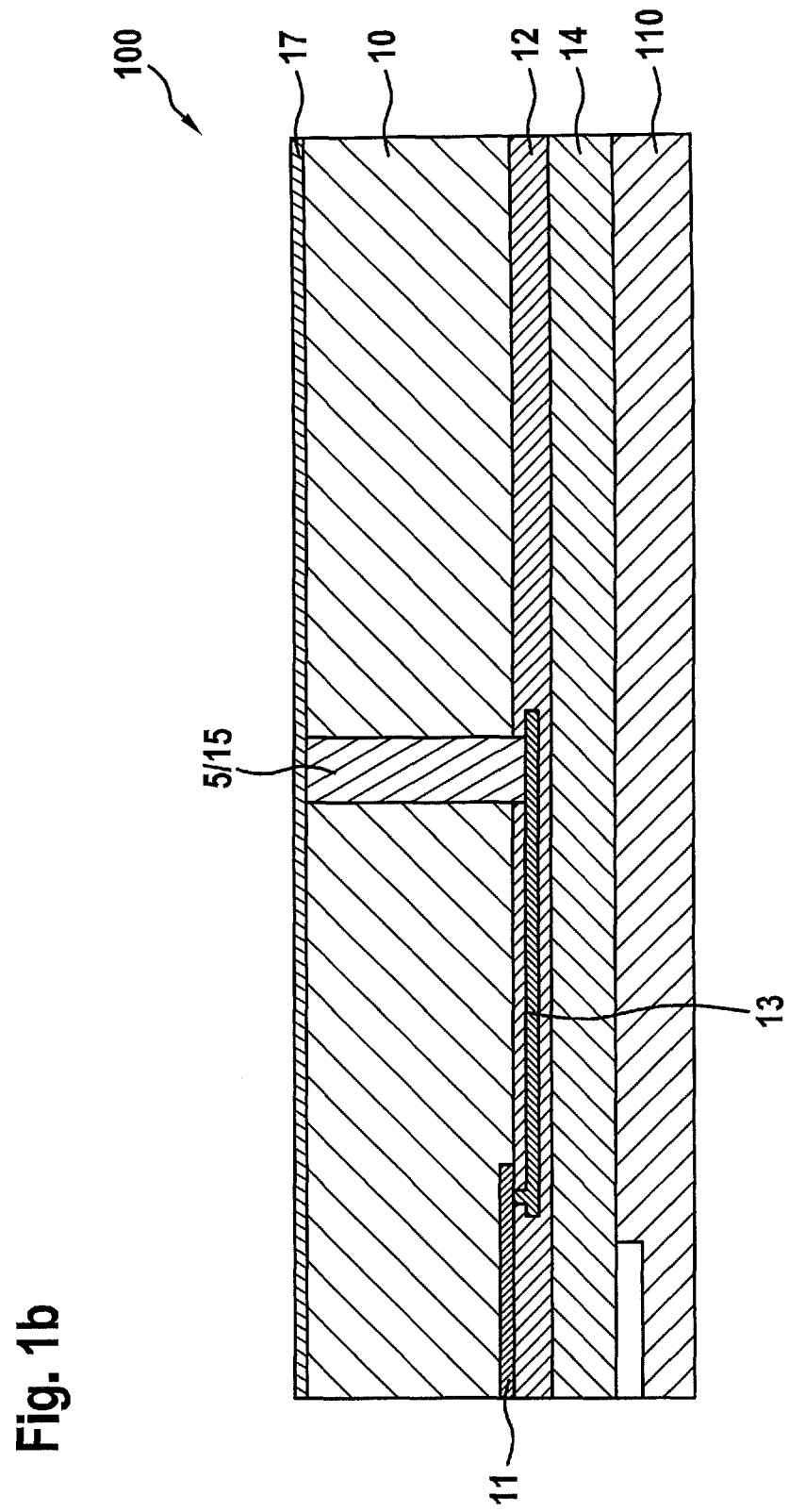

At this point, rear side via opening 15 in silicon substrate 10 has been filled with a metal 5. All known filling methods may be used in such a case. Possible metals are, for example, W, Al, AlCu, AlSiCu, Cu, Ag, Au, Pt, Ti and/or TiN, or also a layer sequence made of these materials. The substrate rear side was subsequently planarized and/or polished. Masking 16 was also removed in the process. A passivation layer 17 was then deposited on the substrate rear side thus prepared. FIG. 1b shows MEMS component 100 with a metal pillar 5, which extends from the rear side of the substrate to metallization 13 in dielectric intermediate layer 12 of the front side layer structure, and thus establishes an electrical connection between the rear side of the substrate and the conductor path layer formed in metallization 13.

In a second process sequence of the method according to present the invention, metal pillar 5 of the via is then exposed in silicon substrate 10. A rear side trench process is used for such a purpose.

Figure 1C:
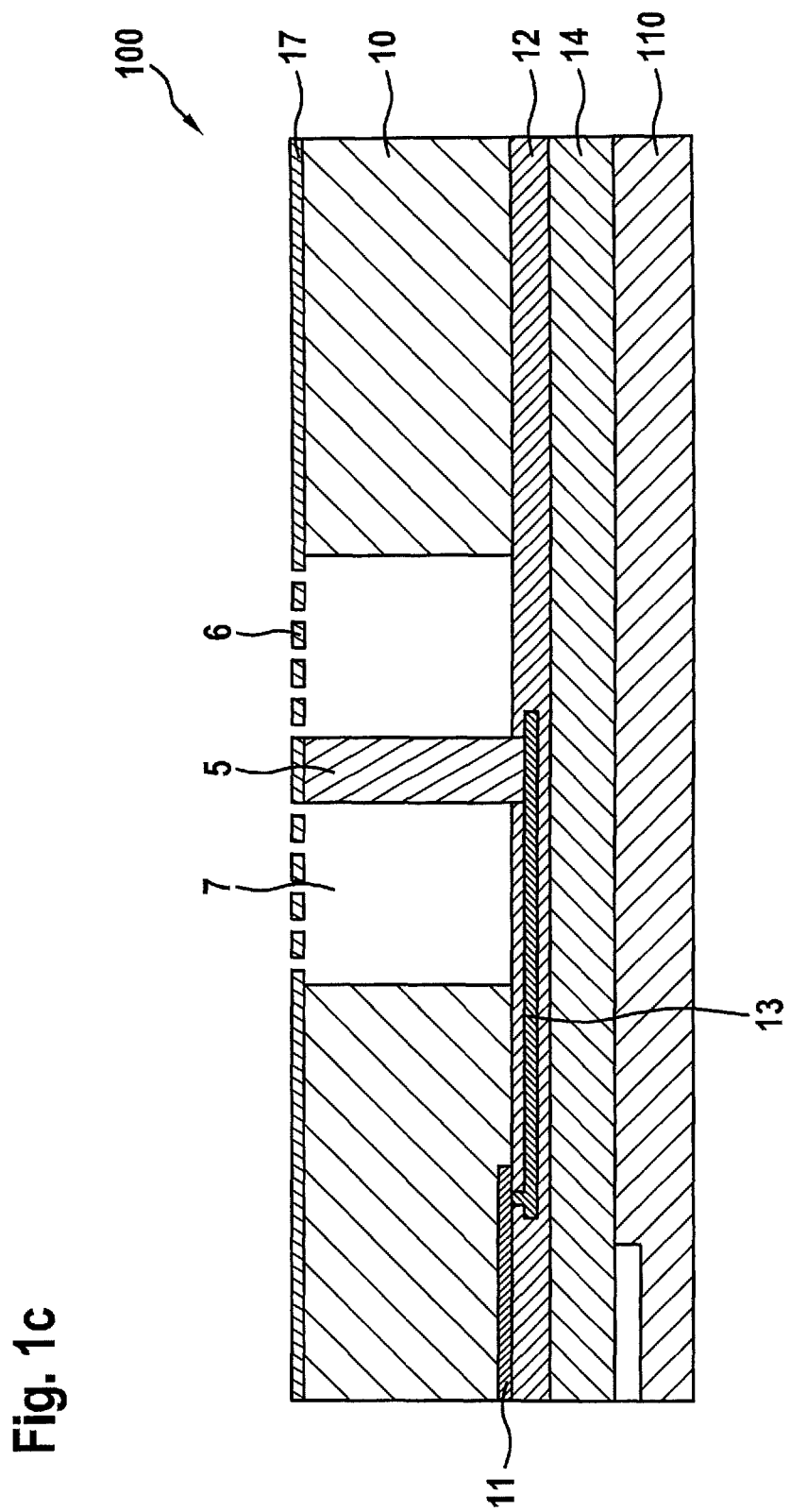

In the exemplary embodiment described herein, the rear side passivation layer 17, consisting of $SiO_2$, has been configured as a trench mask for this rear side trench process with the aid of standard lithography methods and standard etching methods by being provided with a lattice structure 6 in an area adjacent to metal pillar 5. The open areas and cross-pieces of lattice structure 6 were designed in this case so that they may be easily undercut and resealed. FIG. 1c shows MEMS component 100 after the rear side trench process, in which lattice structure 6 of the trench mask has been completely undercut so that a continuous isolation trench 7 is created in silicon substrate 10. Isolation trench 7 extends to dielectric intermediate layer 12 of the front side layer structure. This acts as a deep etch stop—as in the case of opening 15. Metal pillar 5 has been fully exposed in silicon substrate 10. It acts as a lateral etch stop, since metal 5 is not attached as a result of the trench process. This also ensures that no degeneration of via 5 occurs even at the bottom of the trench. Parasitic capacitances in the area of via 5 are kept to a minimum by isolation trench 7.

Figure 1D:
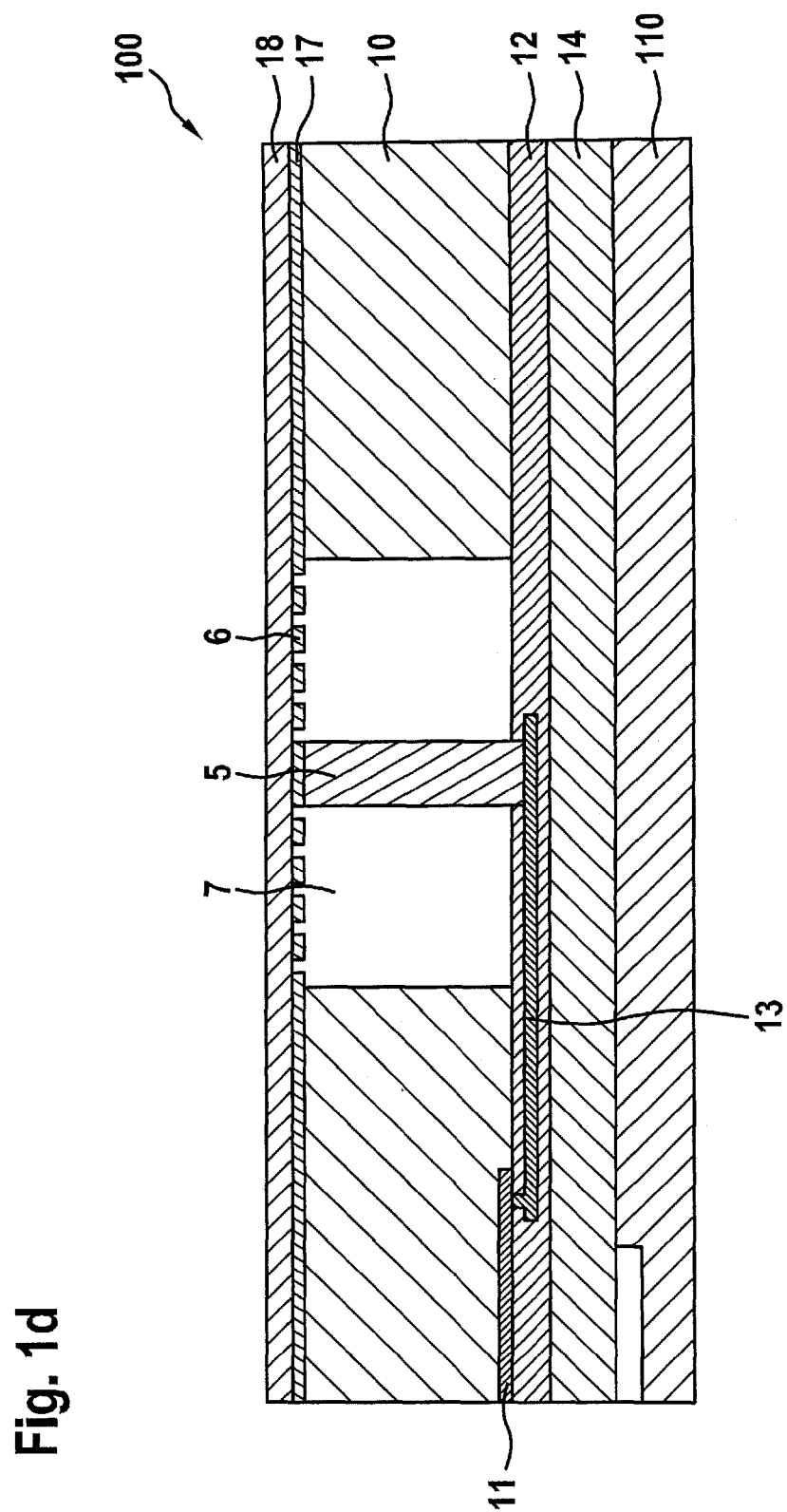

FIG. 1d shows MEMS component 100 after a sealing layer 18 has been produced on the rear side of the component and, in particular, over lattice structure 6 of the trench mask in order to seal the rear side of isolation trench 7. In this way, via 5 is protected from environmental influences such as, for example, moisture or contamination which could cause undesirable leakage currents. Possible materials for sealing layer 18 include, $SiO_2$, silicon nitride, silicon oxynitride, SiC and $Al_2O_3$, or also a layer sequence made of these materials. Additionally, a metal layer made, for example, from AlCu or AlSiCu may be provided inside or on sealing layer 18 which improves the barrier characteristics of sealing layer 18 against moisture. The position of the metal layer in this case may be restricted to the area of lattice structure 6 or it may extend beyond it. In another variant embodiment, the metal layer may also extend outside lattice structure 6 past a step in passivation layer 17—sealing layer 18—insulation layer 19—layer system down to the silicon substrate. This may ensure that even laterally, no moisture may enter into the area of isolation trench 7. The same may also be achieved if isolation trench 19 is made of a particularly moisture-impervious material such as silicon nitride and reaches past a step in passivation layer 17—sealing layer 18—layer system down to the silicon layer.

Figure 1E:
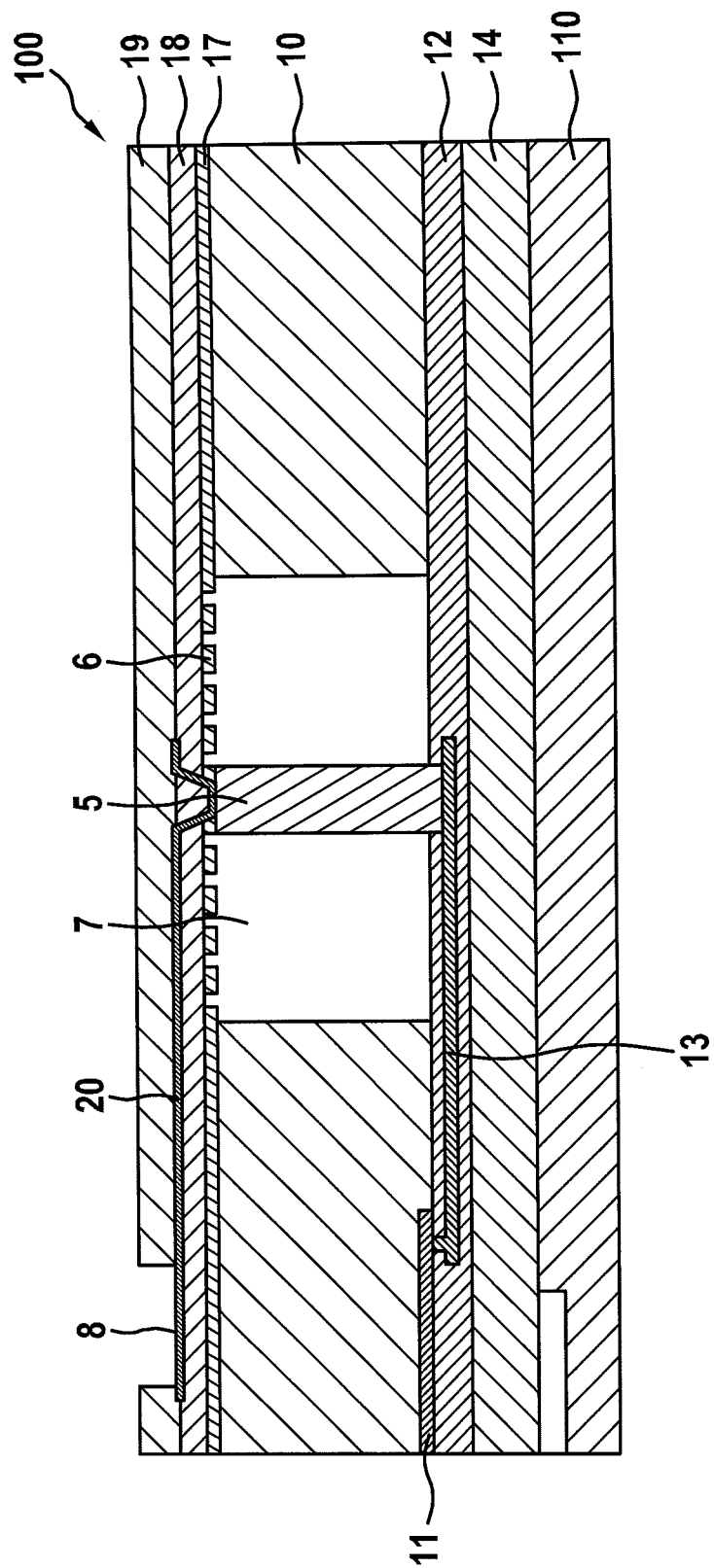

In the exemplary embodiment explained herein, the rear side of MEMS component 100 has been provided with a layer sequence of insulation layers 18, 19 and a metal layer 20. Individual layers 18 to 20 have been specifically structured in order to produce a rear side terminal pad 8 for via 5, which is depicted in FIG. 1e. For this purpose, a contact hole was produced in sealing layer 18 over the metal pillar and via 5. Metal layer 20 was deposited over this and structured using known methods in order to form conductor paths and terminal pad 8. Finally, additional passivation layer 19 was deposited over conductor path layer 20 thus produced and opened in the area of terminal pad 8. In this way, it is also possible to form multiple conductor path layers in the rear side layer sequence of such a MEMS component.

Figure 2:
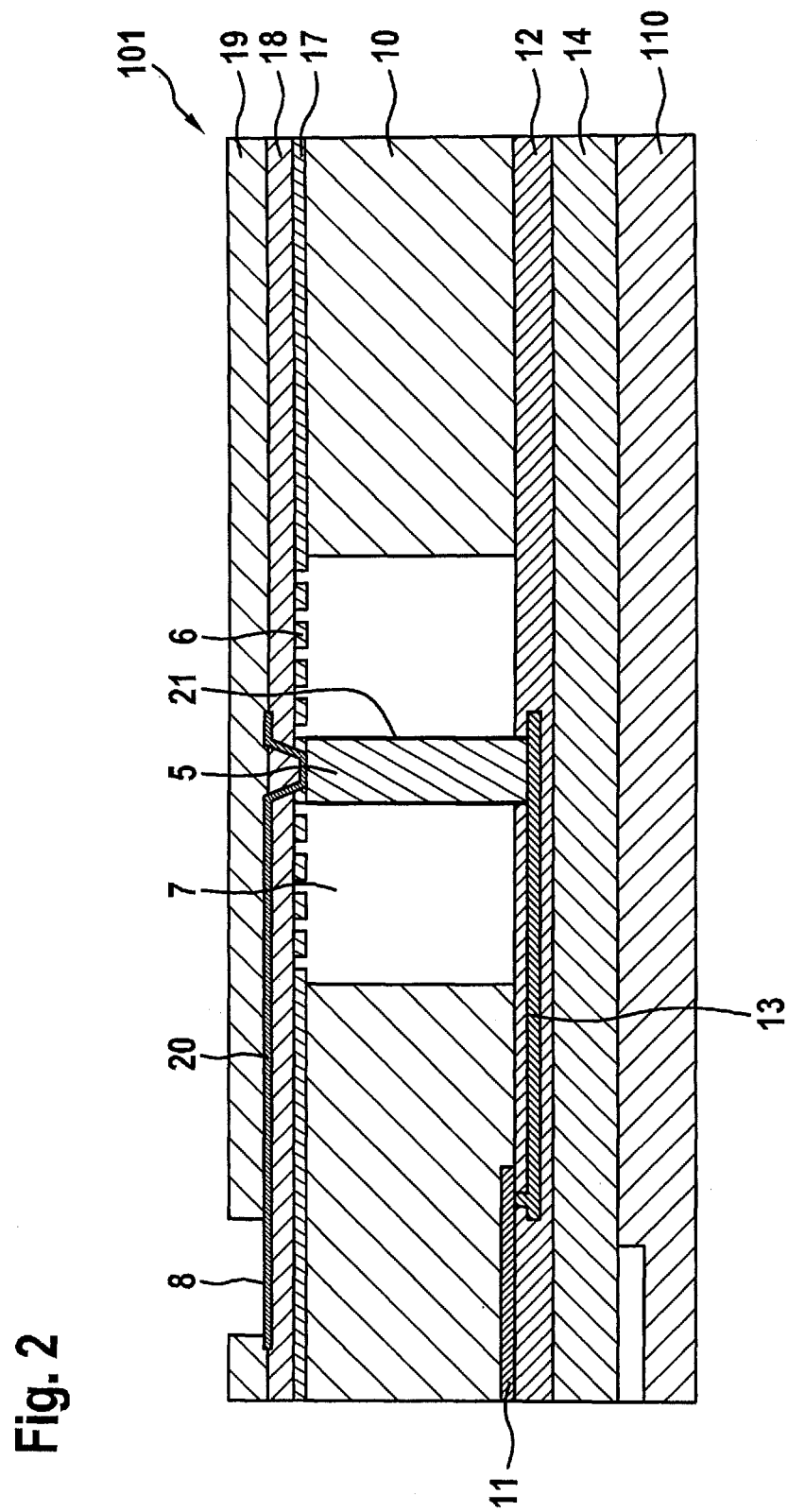
FIG. 2 illustrates a variant of the method according to the present invention with reference to a schematic sectional view through a semiconductor substrate having a via with a dielectric coating.

MEMS component 101 depicted in FIG. 2 differs from MEMS component 100 described above solely in the implementation of the via. Hence, the following explanations are restricted to this aspect. Otherwise, reference is made to the description of FIGS. 1a through 1e.

In the case of MEMS component 200, the side walls of via opening 15 were provided with an insulation layer 21 prior to filling with metal 5, in order to prevent a diffusion of metal 5 into adjacent silicon substrate 10. For this purpose, $SiO_2$, for example, may be deposited in a PECVD method on the structured rear side of the silicon substrate. Optionally, multiple insulation layers made, for example, from $SiO_2$, silicon nitride, SiC and $Al_2O_3$ may also be applied to the side walls of via 15, or also a layer sequence of insulation layers and metal layers.

At this point, it is also to be noted that via opening 5 may also be filled with multiple different metals or a sequence of metals. If, for example, the electrode structure is intended to be used for measuring the conductance of liquid media, it may be advantageous to provide a particular corrosion-resistant metal such as Pt on the outside of the electrode structure, whereas the core is formed by a particularly conductive metal such as Cu.

In a particularly advantageous variant of the method according to the present invention, a structured metal layer is employed as a trench mask in the trench process for exposing metal pillar 5 in silicon substrate 10, which is also utilized for electrically contacting the metal pillar and via 5. A method variant of this type is explained in greater detail below with reference to FIGS. 3a through 3c. Here too, explanations are limited to the differences between it and the method variant described in connection with FIGS. 1a through 1e, to which reference is otherwise made.

Figure 3A:
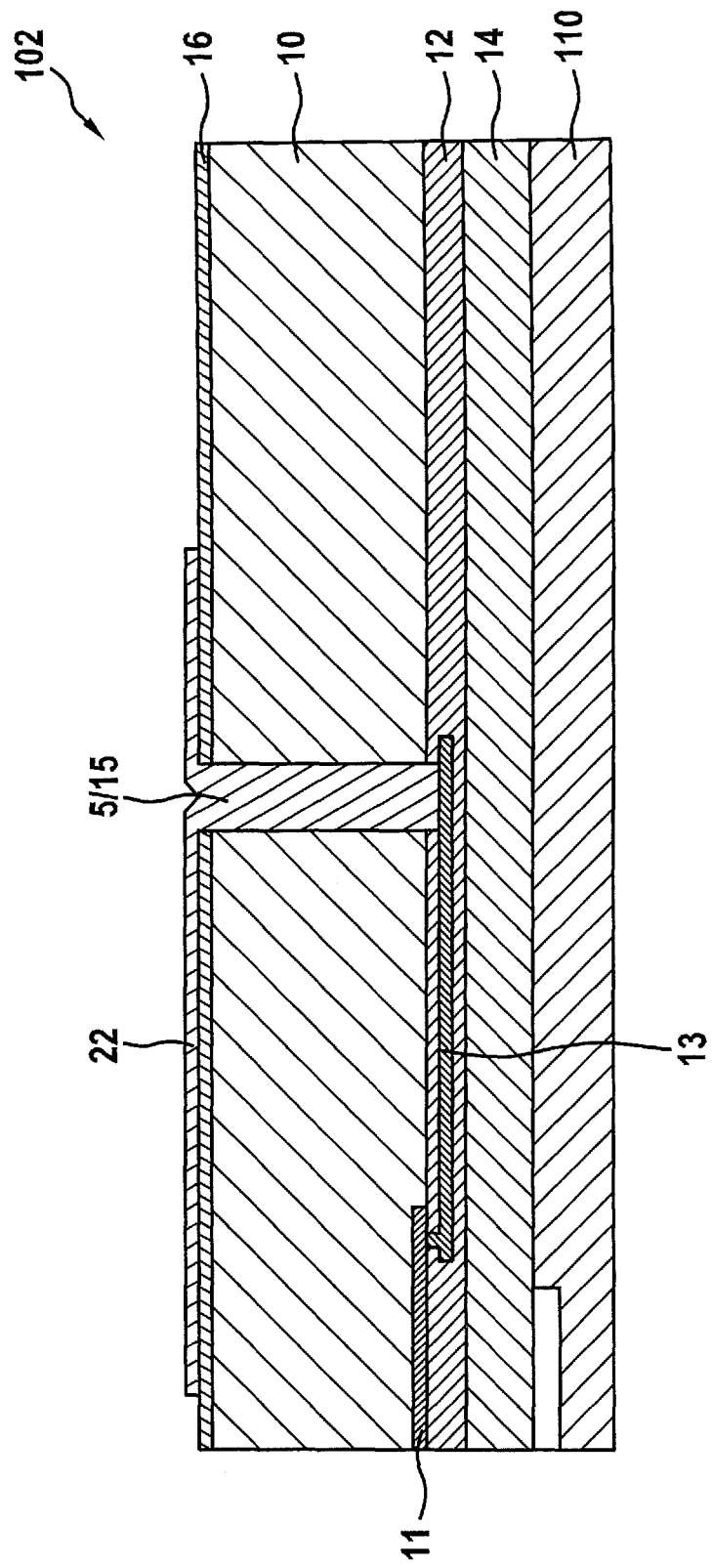

FIG. 3a shows a MEMS component 102 after rear side opening 15 in silicon substrate 10 has been filled with a metal 5. Metal 5 in this case has also been deposited on the masked rear side of silicon substrate 10.

Figure 3B:
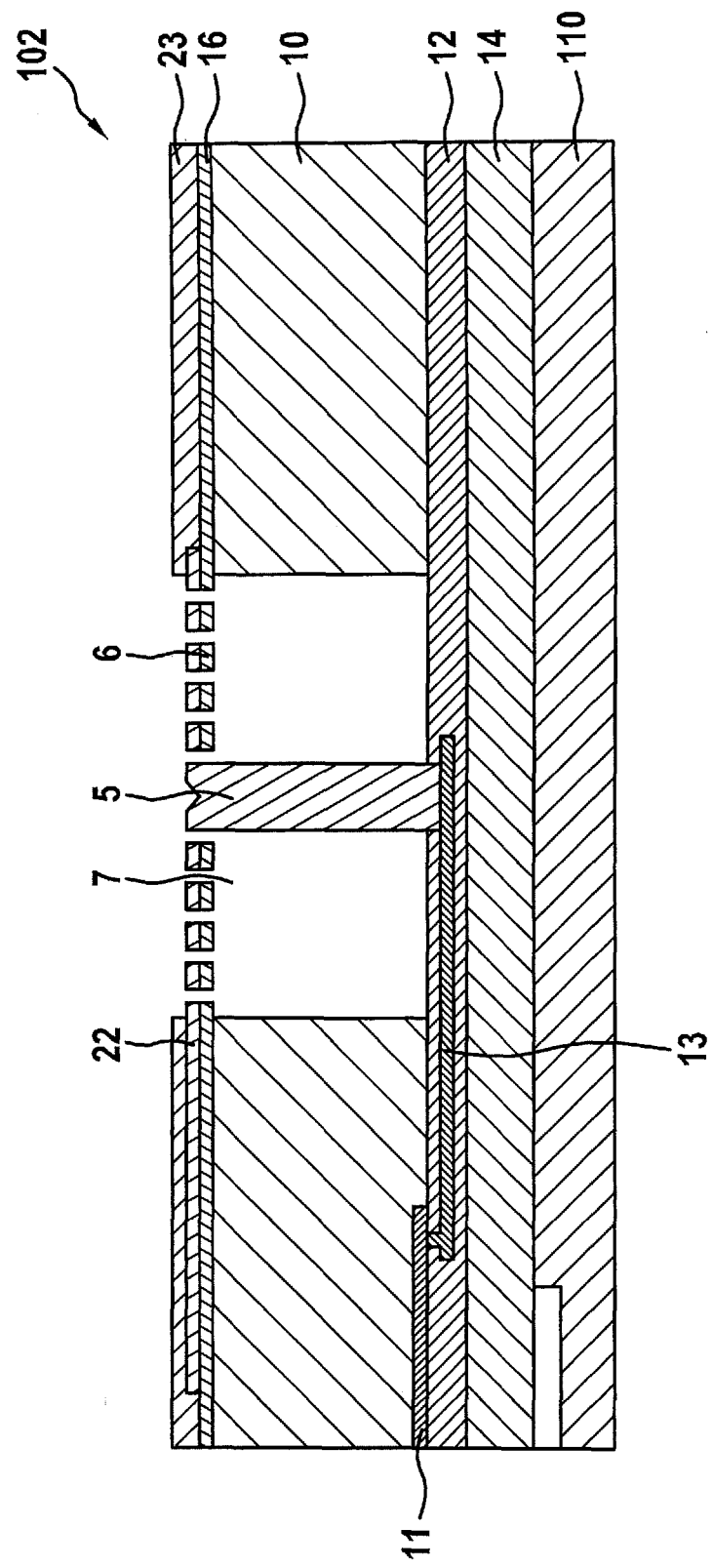

In a subsequent structuring process, conductor paths and a terminal pad 8 for via 5 were formed on the one hand, and a lattice structure 6 in the area adjacent to metal pillar 5 on the other hand, in this metal layer 22. An insulation layer 23 made, for example, of $SiO_2$ was then deposited on the metal layer 22 structured in this way and opened in the area of lattice structure 6. During the structuring process, lattice structure 6 was also carried over to passivation layer 16 situated beneath. Structured metal layer 22 in conjunction with passivation layer 16 structured in the same manner was then utilized as masking for the trench process for producing isolation trench 7. The result of this process sequence is depicted in FIG. 3b, which shows MEMS component 102 with exposed via 5. Alternatively, insulation layer 23 may be omitted and metal lattice 6 and underlying insulation layer 16 may be structured with a resist mask. The resist mask may then also remain on the surface during the isolation trench process and protect the surface from an etching attack.

Unlike a trench mask made of $SiO_2$, a metal mask made, for example, of Al, AlCu or AlSiCu is not appreciably attacked by the silicon trench process. This means that the width of the lattice cross-pieces and the size of the lattice openings may in this case be selected independently of the trench depth. This may ensure that lattice structure 6 may also be securely resealed with a sealing layer of a defined thickness following production of isolation trench 7. FIG. 3c shows MEMS component 102 after such a sealing layer 18 has been produced on the rear side of the component and, in particular, over lattice structure 6 and has been opened in the area of terminal pad 8.

At this point, it is also to be noted that metal layer 22 need not necessarily be produced in conjunction with the filling of via opening 5, but may also be applied separately, i.e., subsequently on rear side passivation layer 16. Moreover, metal layer 22 may also be applied directly to the rear side of the substrate, at least in the area of isolation trench 7 to be produced.

Figure 4:
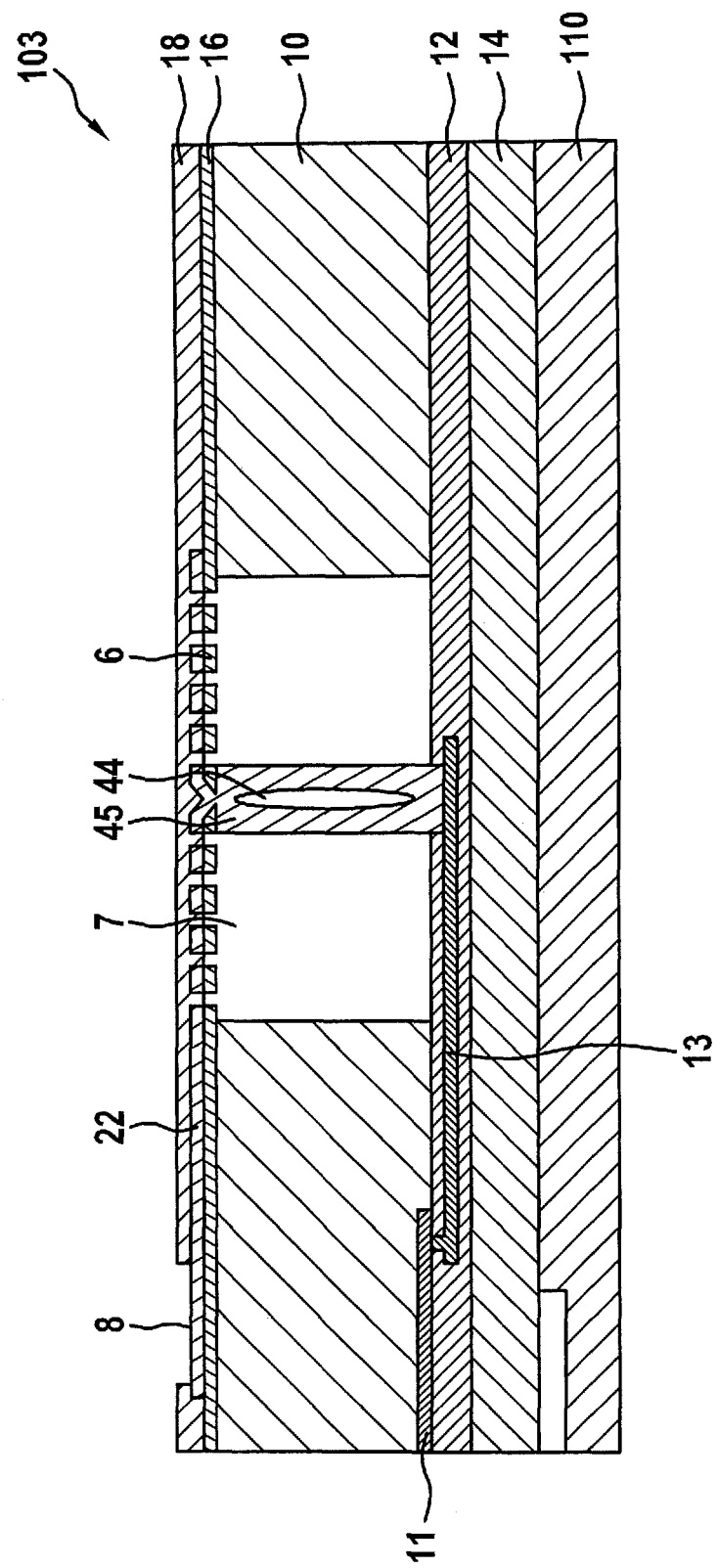
FIG. 4 illustrates a variant of the method according to the present invention, in which the opening for the via has not been completely filled with metal.

FIG. 4 depicts a MEMS component 103 in which via opening 15 has not been completely filled with metal. In this case, metal pillar 45 encloses a cavity 44. In this variant, masking layer 16 was specifically undercut during production of via opening 15, so that this opening 15 when being filled with metal was superficially more rapidly sealed than it was completely filled up.

Figure 5:
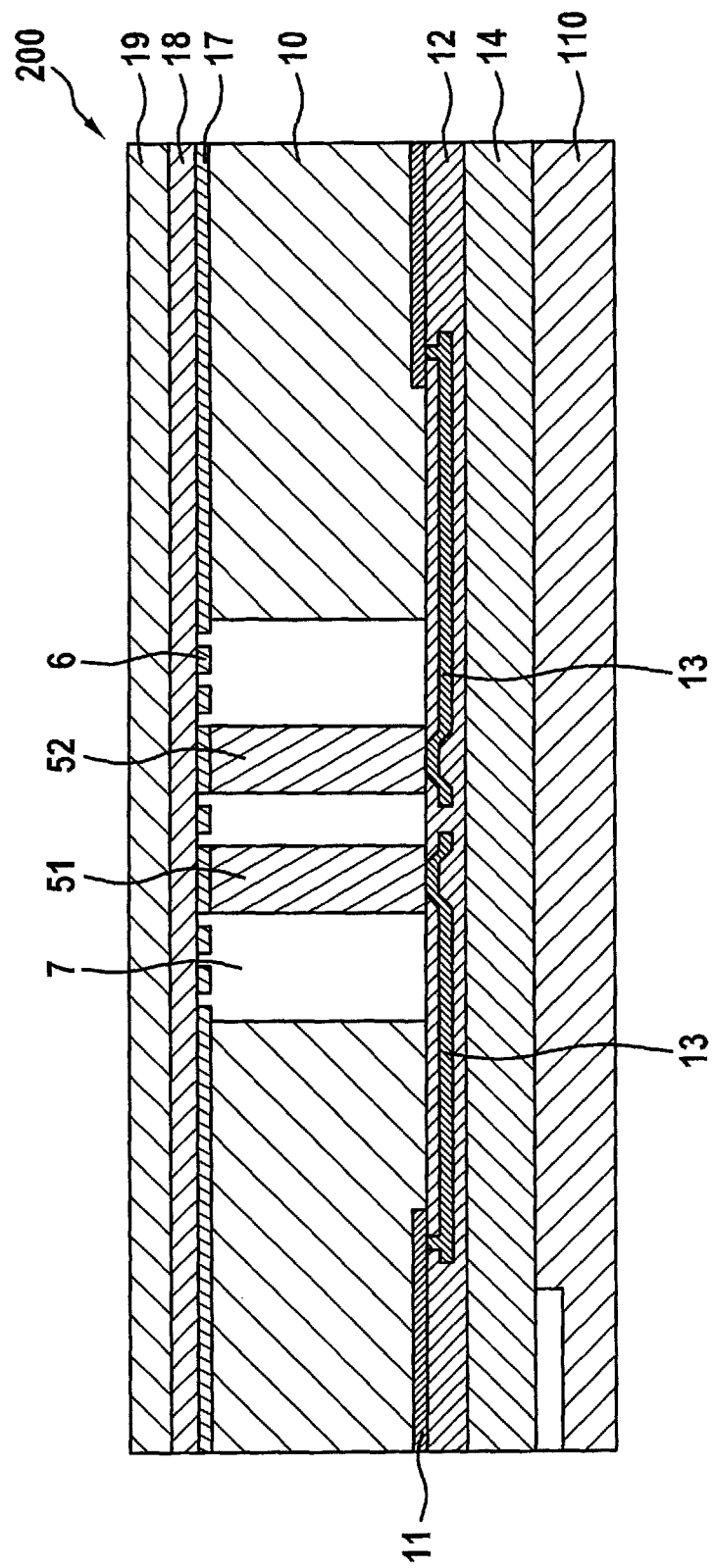
FIG. 5 shows a schematic sectional view through a semiconductor substrate having a capacitor arrangement produced according to the present invention.
Figure 6A:
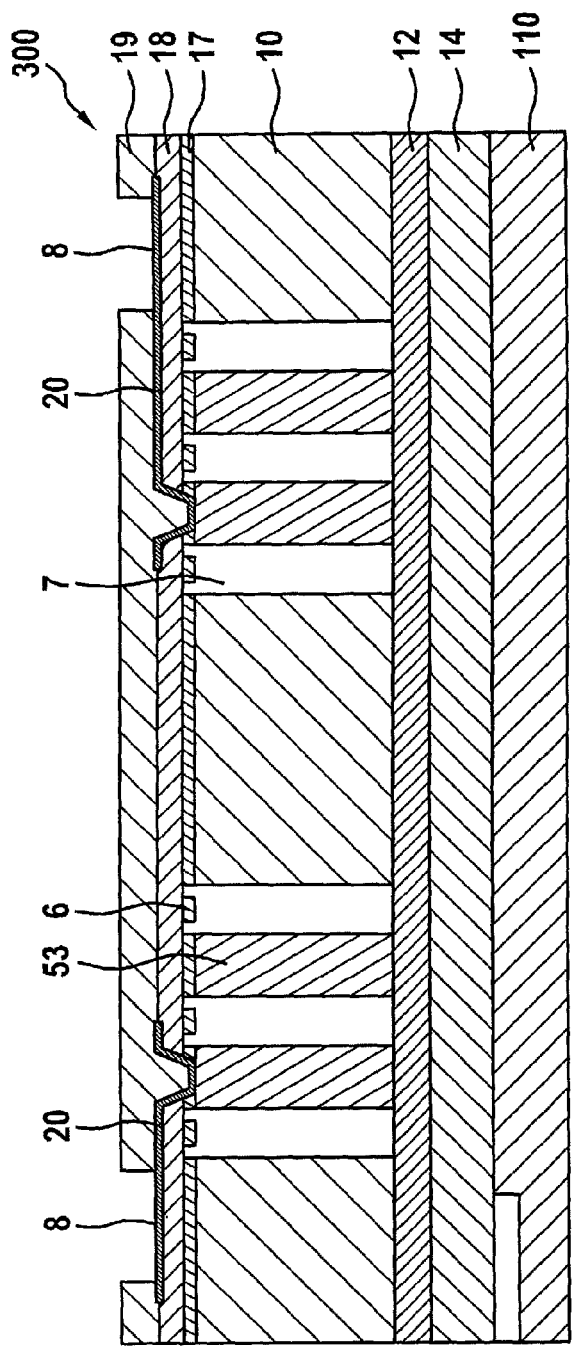
FIG. 6a shows a schematic sectional view through a semiconductor substrate having a coil arrangement produced according to the present invention.
Figure 6B:
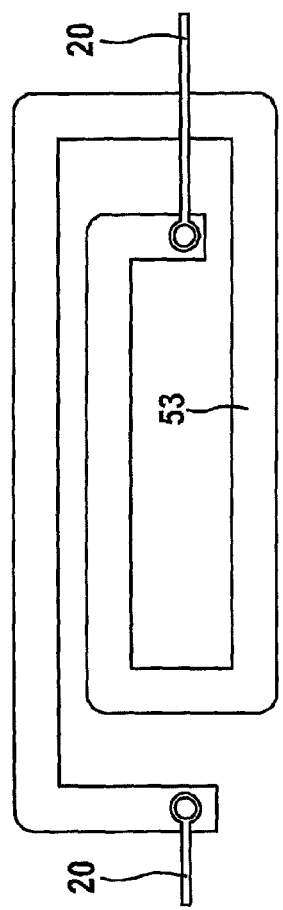
FIG. 6b shows a top view of this coil arrangement.

While the method according to the present invention was used in a MEMS component in all of the above described exemplary embodiments for implementing a via, FIGS. 5 and 6 each show a MEMS component 200 and 300 in which the metal structures produced according to the present invention have an independent circuit function in silicon substrate 10.

In the case of MEMS component 200 depicted in FIG. 5, a plate capacitor structure has been implemented with the aid of the method according to the present invention, having two metal electrodes 51 and 52, which extend over the entire thickness of silicon substrate 10 and which are electrically insulated from one another and from the surrounding substrate material by isolation trench 7. Two metal electrodes 51 and 52 are electrically contacted in this case via conductor path layer 13 in the front side of the layer structure of MEMS component 200, but may also be implemented in a conductor path layer of the rear side of the layer structure.

The method according to the present invention makes it possible to produce capacitor assemblies having multiple metal electrodes connected in parallel and a correspondingly large capacitance. The method in this case is not limited to plate capacitor structures. Rather, cylindrical capacitors may also be produced in this way. Such capacitor arrangements may be used, for example, for implementing RC elements having a high time constant.

In the case of MEMS component 300 depicted in FIGS. 6a, b, a coil arrangement 53 has been implemented in silicon substrate 10 with the aid of the method according to the present invention. The individual coil windings extend over the entire thickness of silicon substrate 10 and are electrically insulated from one another and from the surrounding substrate material by isolation trench 7, which is illustrated in particular by the sectional view of FIG. 6a. The two coil ends are electrically contacted in this case via conductor path layer 20 in the rear side of the layer structure of MEMS component 300, but may also be implemented in a conductor path layer of the front side of the layer structure, which has proven advantageous, for example, in the case of "flat coils." Cylindrical coils are electrically contacted via both conductor path layers.

Since the windings of coil 53 are all produced simultaneously with the aid of the method according to the present invention, different inductances may also be very easily produced on one wafer. In this way, it is possible, for example, to implement RL elements for energy feed and/or signal decoupling in order to provide the component with a transponder function.

Figure 7:
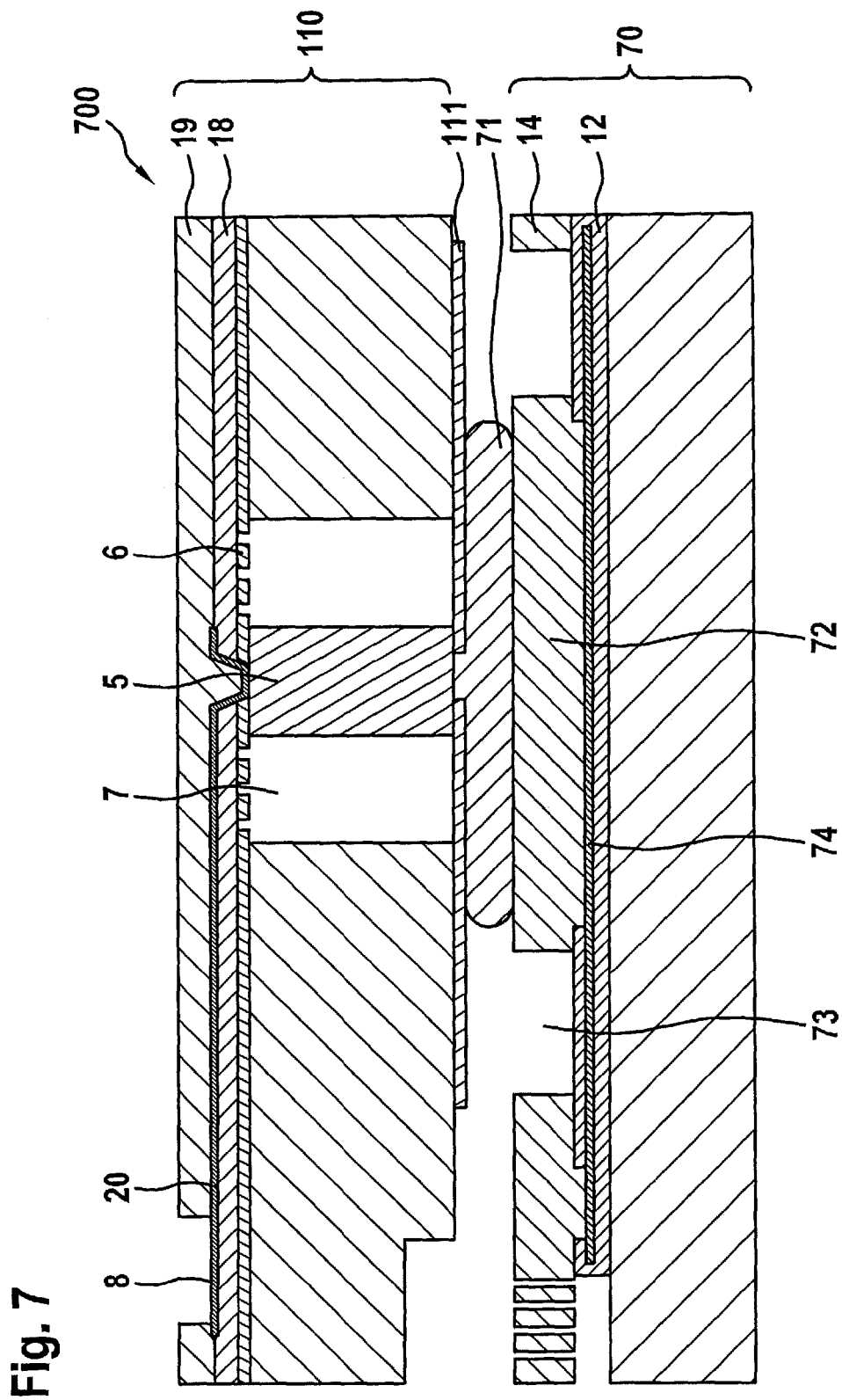
FIG. 7 shows a schematic sectional view through a MEMS component having a cap wafer with a via produced according to the present invention.

Metallic vias may also be implemented with the aid of the method according to the present invention in a cap wafer 110 which constitutes part of a chip stack 700 or wafer stack, which is depicted in FIG. 7. In this case, via 5 must be electrically connected via a conductive intermediate layer 71 between cap wafer 110 and chip 70 situated underneath and a suitably configured contact area 72 of chip 70. An Al/Ge— or an AuSn layer, for example, may be utilized as a conductive intermediate layer 71, which may also be used as a bonding layer for mounting cap wafer 110 on chip 70. In the exemplary embodiment depicted here, a contact area 72 is formed in EPI-layer 14 of MEMS chip 70 which is separated from surrounding EPI layer 14 by a circumferential isolation trench 73. Contact area 72 is connected to an underlying wiring layer 74. Metallic via 5 is introduced on MEMS chip 70 in cap wafer 110 only after cap wafer 110 has been mounted. In this variant, the trench process for producing via opening 15 stops on intermediate or connecting layer 71 and, if necessary, also on passivation layer 111.

Figure 8:
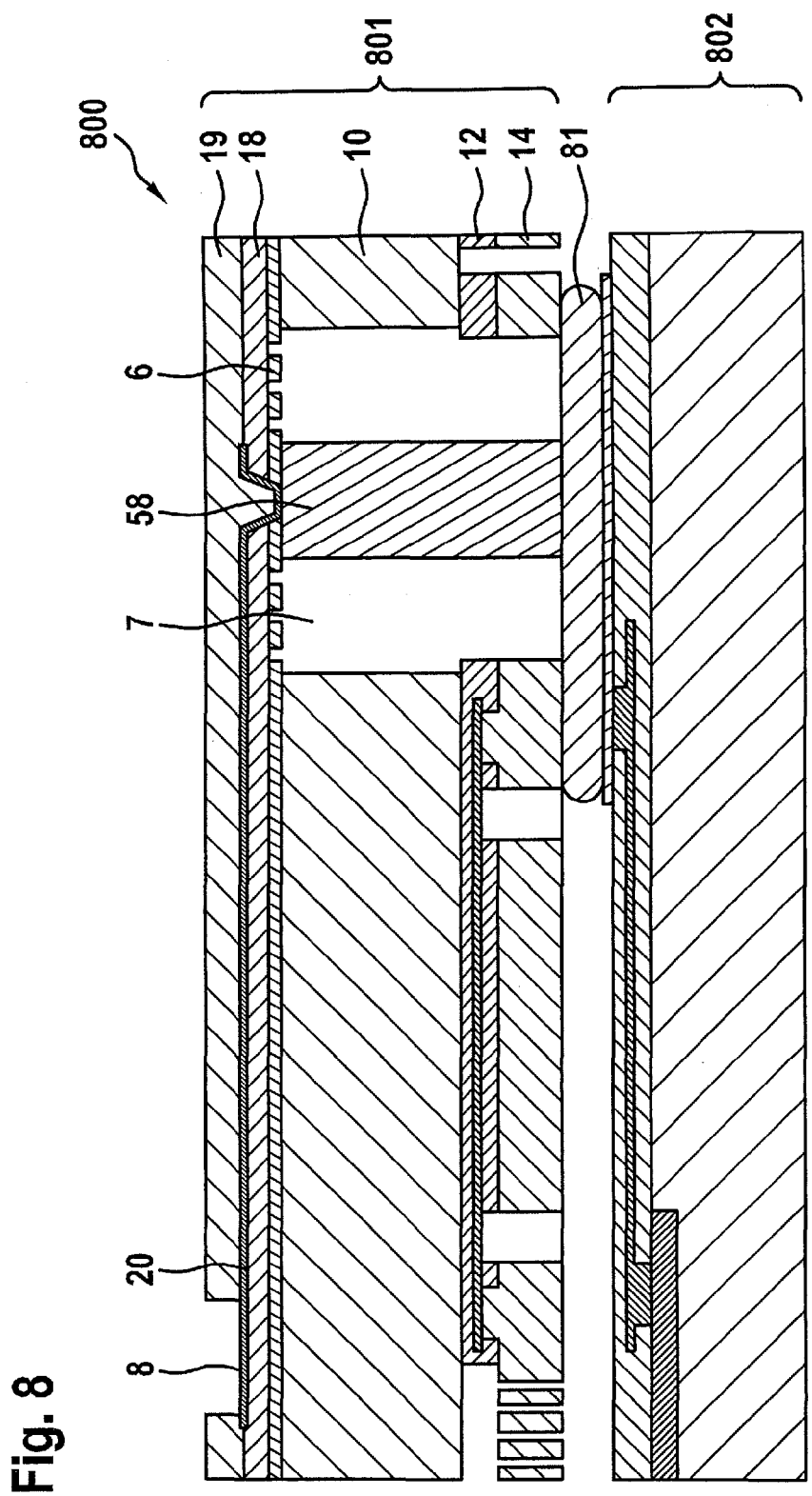
FIG. 8 shows a schematic sectional view through a MEMS component having a via produced according to the present invention which is mounted on an ASIC.

FIG. 8 shows a chip stack 800 having a MEMS component 801, which is mounted face down on an ASIC component 802. In MEMS component 801 a via 58 is formed which was produced only after the assembly according to the method according to the present invention. Via 58 extends from the rear side of silicon substrate 10 of MEMS component 801 through the entire silicon substrate and the front side layer structure of MEMS component 801 up to the electrically conductive intermediate or connecting layer 81 between MEMS component 801 and ASIC component 802. This exemplary embodiment illustrates that the method according to the present invention is not limited to the production of metal structures in a standard semiconductor substrate, but also allows metal structures to be implemented in a layer structure.

What is claimed is:

1. A method for producing at least one metal structure in a semiconductor substrate having a front side provided with a front side layer structure, comprising:
    producing at least one opening, which extends at least to the front side layer structure, in a rear side of the semiconductor substrate in an area corresponding to a location of the metal structure;
    filling the at least one opening at least partially with at least one metal to create a metal structure which extends from the rear side of the semiconductor substrate at least to the front side layer structure;
    masking the rear side of the semiconductor substrate for a trench process for exposing the metal structure, wherein the trench mask includes a lattice structure in an area adjacent to the metal structure;
    producing an isolation trench adjacent to the metal structure, wherein the metal structure acts as a lateral etch stop and the lattice structure in the trench mask is laterally undercut; and
    applying at least one sealing layer to the trench mask so that the isolation trench below the lattice structure is closed off as a cavity.

2. The method as recited in claim 1, wherein walls of the at least one opening in the rear side of the semiconductor substrate are initially coated with at least one dielectric material before being at least partially filled with the at least one metal.

3. The method as recited in claim 2, wherein the trench mask includes at least one structured metal layer, and wherein at least one electrical connection for the metal structure is formed in the metal layer.

4. The method as recited in claim 3, wherein the at least one structured metal layer of the trench mask is produced on the rear side of the substrate when the at least one opening in the rear side of the semiconductor substrate is filled.

5. The method as recited in claim 3, wherein the substrate is a silicon substrate.

6. The method as recited in claim 3, wherein the semiconductor substrate is mounted as a cap on a component, and wherein the at least one opening in the rear side of the semiconductor substrate extends at least to a connecting layer between the cap and the component such that filling of the at least one opening in the rear side of the semiconductor substrate results in a formation of a metal pillar which extends from the upper side of the cap to the connecting layer.

7. The method as recited in claim 3, wherein:
    in the front side layer structure at least one of an electrical functionality and a micromechanical functionality is implemented, the front side layer structure including at least one conductor path layer for electrically contacting the at least one of the electrical functionality and the micromechanical functionality; and
    the at least one opening in the rear side of the semiconductor substrate extends at least to a conductor path layer of the layer structure such that filling of the at least one opening in the rear side of the semiconductor substrate results in a formation of a metal pillar which extends from the rear side of the semiconductor substrate to the conductor path layer of the layer structure.

8. The method as recited in claim 3, wherein the metal structure includes a capacitor arrangement.

9. The method as recited in claim 3, wherein the metal structure includes a coil arrangement.

* * * * *